United States Patent
Liu et al.

(10) Patent No.: US 8,618,843 B2
(45) Date of Patent: Dec. 31, 2013

(54) HIGH SPEED SERIAL INPUT/OUTPUT BUS VOLTAGE MODE DRIVER WITH TUNABLE AMPLITUDE AND RESISTANCE

(75) Inventors: Stephen S. Y. Liu, Toronto (CA); Kun Chuai, Markham (CA); Bo Wang, Richmond Hill (CA); Paul Edelshteyn, Toronto (CA); Kristina H. Y. Au, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 64 days.

(21) Appl. No.: 13/333,095

(22) Filed: Dec. 21, 2011

(65) Prior Publication Data
US 2013/0162300 A1 Jun. 27, 2013

(51) Int. Cl.
*H03B 1/00* (2006.01)
(52) U.S. Cl.
USPC .......................................... 327/108; 327/112
(58) Field of Classification Search
None
See application file for complete search history.

(56) References Cited

U.S. PATENT DOCUMENTS

| | | | |
|---|---|---|---|
| 6,047,346 A * | 4/2000 | Lau et al. | 327/158 |
| 7,227,382 B1 | 6/2007 | Talbot et al. | |
| 7,816,942 B2 | 10/2010 | Howe et al. | |
| 8,072,242 B2 * | 12/2011 | Barbier | 326/86 |
| 2007/0132488 A1 * | 6/2007 | Hidaka et al. | 327/112 |
| 2008/0211548 A1 * | 9/2008 | Hayashi et al. | 327/108 |
| 2009/0059712 A1 * | 3/2009 | Lee et al. | 365/230.06 |
| 2011/0109361 A1 * | 5/2011 | Nishio | 327/170 |
| 2011/0133772 A1 * | 6/2011 | Shau | 326/30 |
| 2011/0186930 A1 * | 8/2011 | Kosonocky | 257/355 |

* cited by examiner

*Primary Examiner* — Cassandra Cox
(74) *Attorney, Agent, or Firm* — Volpe and Koenig, P.C.

(57) ABSTRACT

A device having a voltage mode driver with tunable amplitude and resistance that supports a predetermined output resistance and output amplitude is described herein. The voltage mode driver includes multiple configurable drivers. The voltage mode driver is controlled by a control module. Resistance tuning is controlled by the number of active configurable drivers and amplitude tuning is controlled by setting the high or low drive state of each active configurable driver. The slew rate of the device is controlled by delaying the setting of the high or low drive state of an active configurable driver by a predetermined interval.

19 Claims, 4 Drawing Sheets

HIGH SPEED SERIAL INPUT/OUTPUT BUS VOLTAGE MODE DRIVER WITH TUNABLE AMPLITUDE AND RESISTANCE

FIELD OF INVENTION

The present invention is generally directed to electronic circuits.

BACKGROUND

High speed serial input/output busses allow a wide range of modern electronic devices and peripherals to communicate with each other. These electronic devices and peripherals include a transceiver to interface with the high speed serial input/output busses. The transceiver may use a current mode architecture to drive outgoing communications. One example of a high speed serial input/output bus is the high speed universal serial bus (USB) protocol.

SUMMARY OF EMBODIMENTS

A device having a voltage mode driver with tunable amplitude and resistance that supports a predetermined output resistance and output amplitude is described herein. The voltage mode driver includes multiple configurable drivers. The voltage mode driver is controlled by a control module. Resistance tuning is controlled by the number of active configurable drivers and amplitude tuning is controlled by setting the high or low drive state of each active configurable driver. The slew rate of the device is controlled by delaying the setting of the high or low drive state of an active configurable driver by a predetermined interval.

BRIEF DESCRIPTION OF THE DRAWINGS

A more detailed understanding may be had from the following description, given by way of example in conjunction with the accompanying drawings, wherein.

DETAILED DESCRIPTION

High speed serial input/output busses allow a wide range of modern electronic devices and peripherals to communicate with each other. These electronic devices and peripherals include a transceiver to interface with the high speed serial input/output busses. These transceivers nominally use a current mode architecture to drive outgoing communications. A high speed universal serial bus (HS USB) protocol is a non-limiting example of a high speed serial input/output bus. Although the description and examples herein may be with respect to the HS USB, the tunable amplitude and resistance voltage mode driver circuit is applicable to other high speed serial input/busses and compliant device drivers. The impedance and amplitude requirements described herein are for the HS USB and other values may be substituted for other high speed serial input/output busses and compliant devices.

Figure 1:
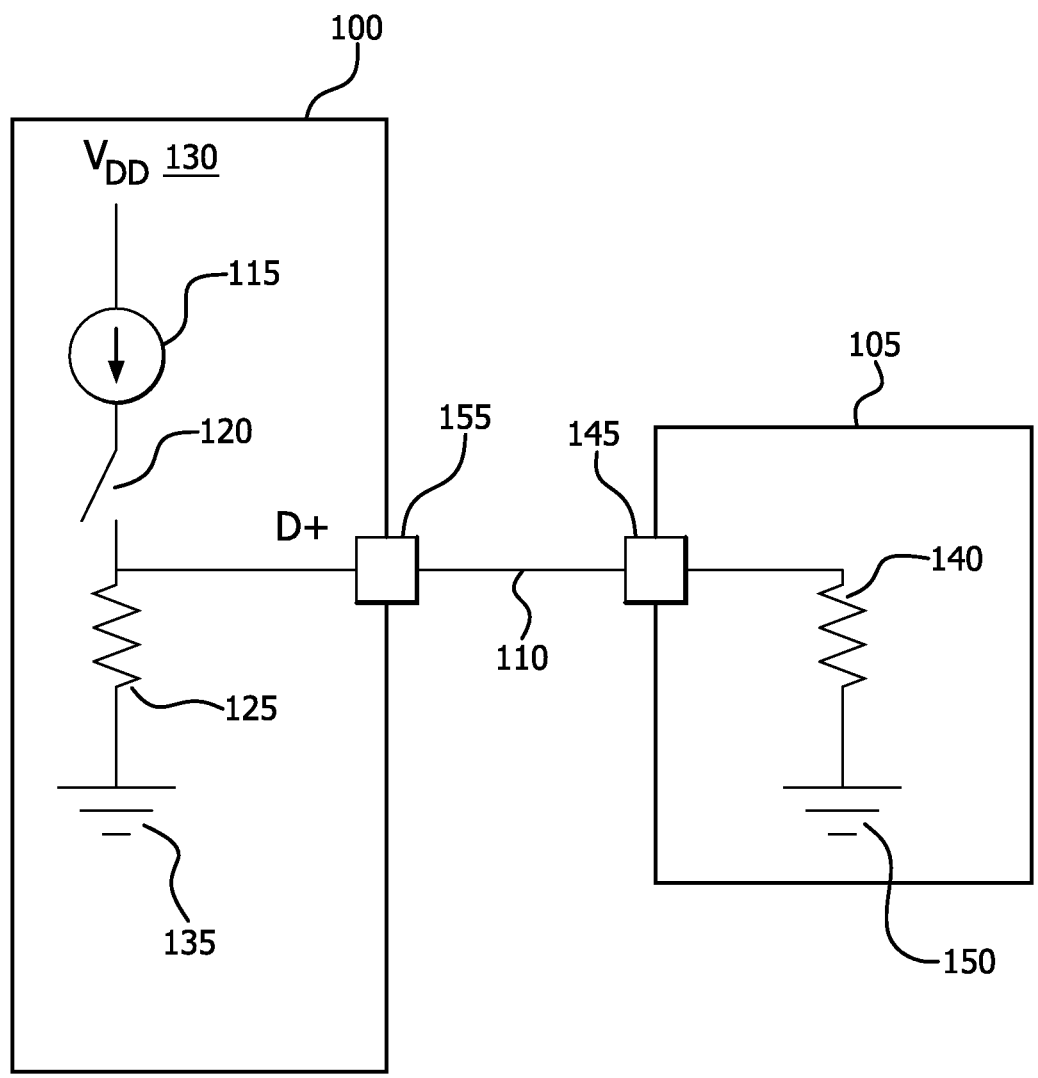
FIG. 1 is a block diagram of a universal serial bus (USB) based on a current mode architecture.

As stated, the HS USB may be used as a non-limiting example to illustrate the tunable amplitude and resistance voltage mode driver circuit. The HS USB compliant devices include transceivers based on current mode architecture, in which a current source drives the outgoing USB communications. The HS USB specifications, for example, may require a 45 Ohms impedance driver providing 400 mV into a 45 Ohms termination. The HS USB current mode driver therefore requires 17.8 mA of current to drive the required levels. FIG. 1 shows a block diagram of a USB transmitter 100 and a HS USB receiver 105 based on a current mode architecture. The USB 100 is connected to the HS USB receiver 105 via a USB cable 110. The USB cable 110 is a four-line serial data bus where two of the lines are power lines and the other two lines form a pair of differential signal lines, (i.e., D+ and D− lines). Although described herein with respect to the D+ signal, the D− signal forming the other half of the differential pair may be generated in a manner similar to that described with respect to the generation of the D+ signal.

The HS USB transmitter 100 includes a current source 115, switch 120 and a resistor 125 that are serially connected between a supply voltage VDD 130 and ground 135. The USB receiver 105 includes a termination resistor 140 connected between a USB port 145 and ground 150.

Operationally, when the switch 120 is closed, a portion of the current supplied by current source 115 flows through resistor 125 to ground to set the output signaling voltage at USB port 155. Another portion of the current flows through USB cable 110 and through resistor 140 to ground 150. By switching switch 120 on and off, the USB transmitter 100 generates the D+ HS USB signal that is transmitted from USB transmitter 100 to USB receiver 105 via USB cable 110. Given this architecture, the current mode driver requires 17.8 mA of current to drive the required levels.

Figure 2:
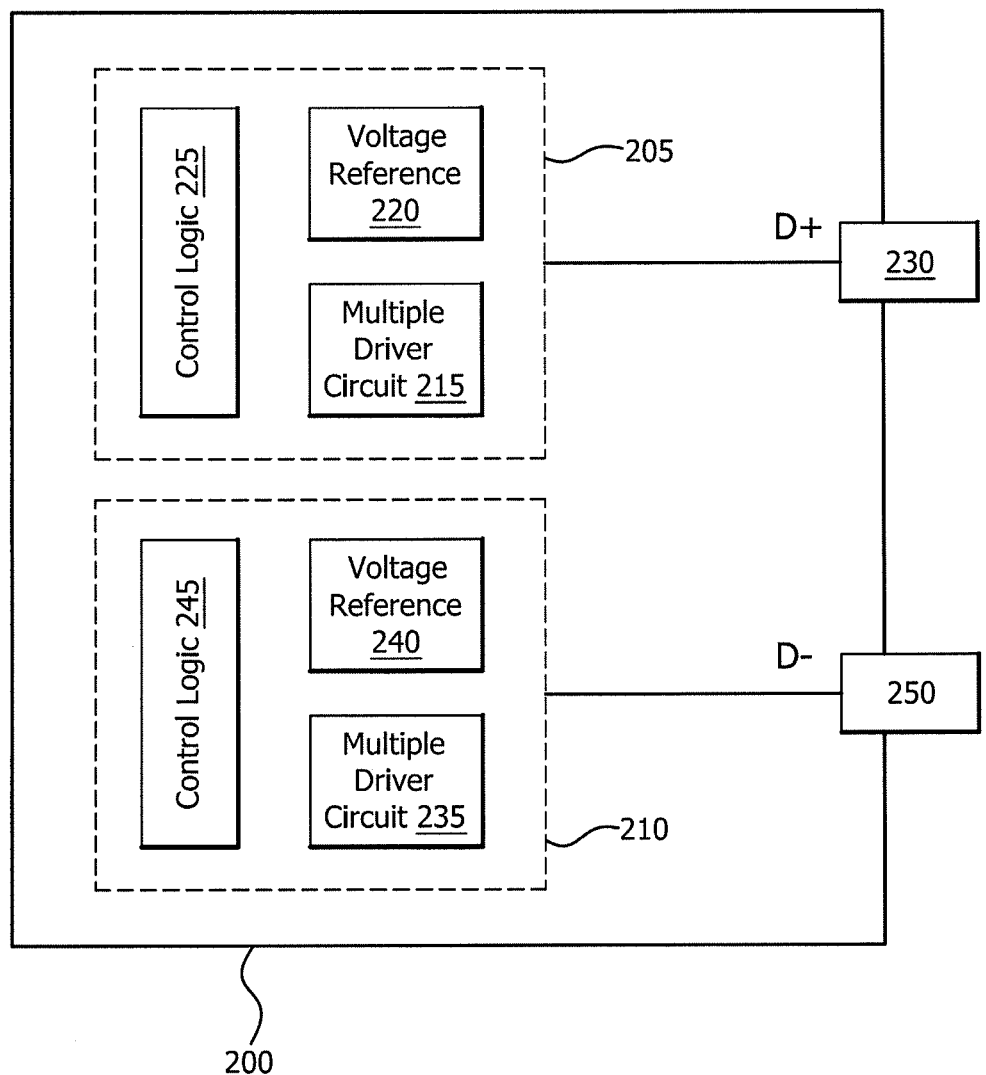
FIG. 2 is an example high level block diagram of a USB HS based on a voltage mode driver circuit.

FIG. 2 is an example high level block diagram of a high speed serial input/output device, for example, a HS USB device 200 that has a D+ voltage mode driver circuit 205 and a D− voltage mode driver circuit 210 that requires 8.9 mA to drive the HS USB communications. Both of the USB HS voltage mode driver circuits 205 and 210 have tunable amplitude and resistance that supports an output resistance of 45 Ohms and output amplitude of 400 mV.

The D+ voltage mode driver circuit 205 includes a multiple driver circuit 215 that is tied to a voltage reference 220, and controlled by a control logic circuit 225. The outputs of the multiple driver circuit 215 are connected to an output pin 230. Similarly, the D− voltage mode driver circuit 210 includes a multiple driver circuit 235 that is tied to a voltage reference 240, and controlled by a control logic circuit 245. The outputs of the multiple driver circuit 235 are connected to a second output pin 250. In another example, the voltage references 220 and 240 may be the same. As described herein below, the multiple driver circuits 215 and 235 each consist of multiple independently controlled configurable drivers, (which may also be referred to as a slice herein), where resistance tuning is accomplished by controlling the number of active configurable drivers and amplitude tuning is controlled by setting the high or low drive state of each active configurable driver. The desired resistance and voltage amplitude can then be achieved by configuring the number of active configurable drivers and their required states as determined by calibration. As long as the voltage reference is greater than 800 mV, the desired output voltage amplitude of 400 mV can be generated as the output voltage amplitude is a linear function of the voltage reference, number of active configurable drivers, and the state of each configurable driver. Moreover, since a low voltage reference can be directly employed, a high voltage regulator is not required.

Figure 3:
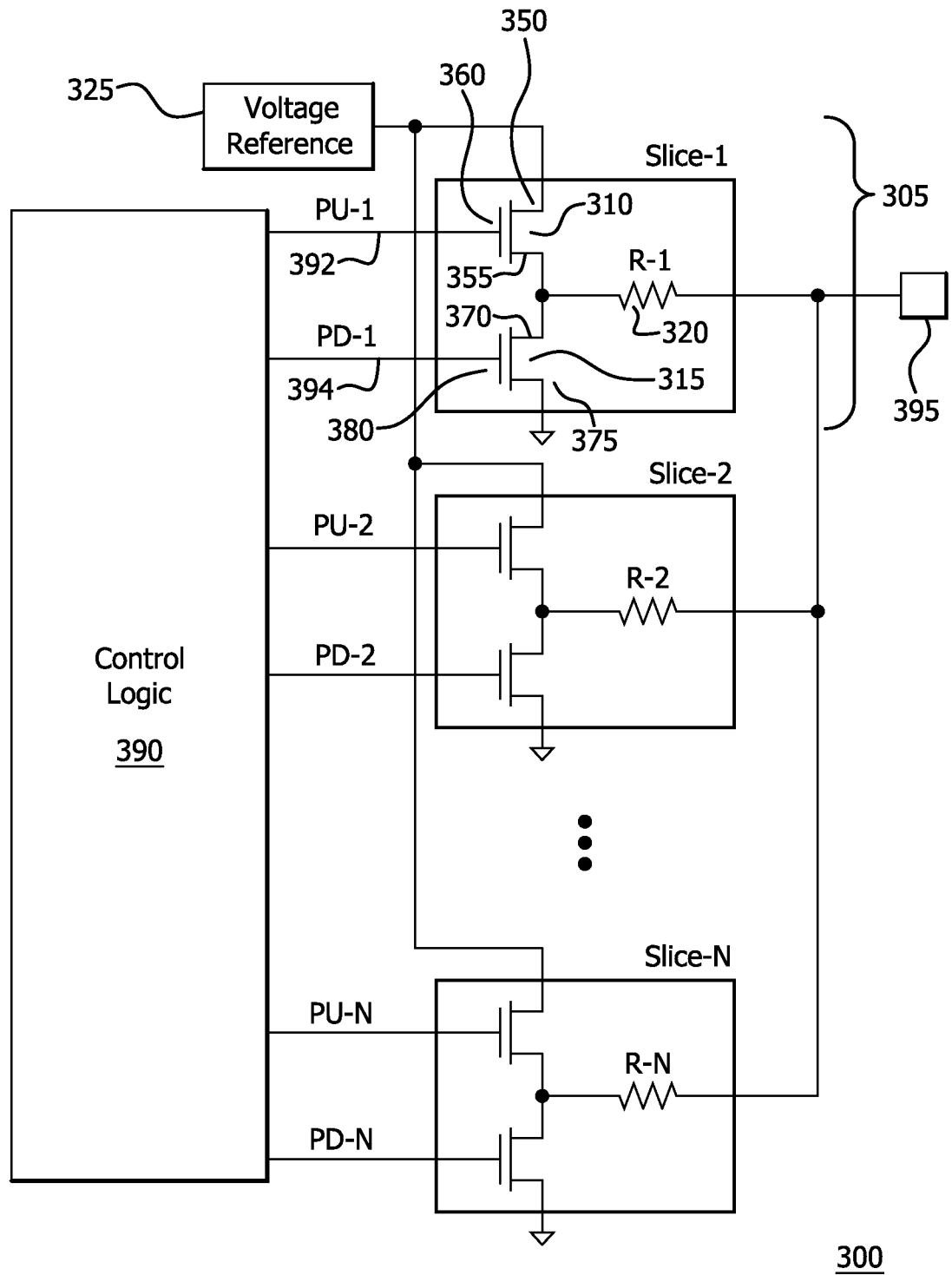
FIG. 3 is an example block diagram of a USB HS based on a voltage mode driver.

FIG. 3 is an example block diagram of a HS USB voltage mode driver circuit 300. The HS USB voltage mode driver circuit 300 includes N configurable driver circuits 305, each tied to a voltage reference 325. Each configurable driver circuit 305 includes a pull-up switching device 310 and a pull-down switching device 315. The pull-up switching device 310 and pull-down switching device 315 may be p-channel or n-channel metal-oxide-semiconductor field-effect transistor (MOSFET) devices or other similar devices. For purposes of illustration, FIG. 3 illustrates the pull-up switching device 310 and pull-down switching device 315 as MOSFETs having a standard source, gate and drain configuration. For each configurable driver circuit 305, the voltage reference 325 is tied to a source 350 of the pull-up switching device 310. A drain 355 of the pull-up switching device 310 is tied to a source 370 of the pull-down switching device 315, which is also tied to a resistor 320. A gate 360 of pull-up switching device 310 is tied to a pull-up control signal (PU-1 . . . PU-N) 392 and a gate 380 of pull-down switching device 315 is tied to a pull-down control signal (PD-1 . . . PD-N) 394, where the pull-up control signal 392 and pull-down control signal 394 are sent by a control logic 390. The outputs of the configurable driver circuits 305 are tied to an output pin 395. As noted with respect to FIG. 2, a full HS USB transmitter consists of a second voltage driver circuit that provides the complement of the first signal on a second output pin.

Operationally, enabling or disabling a combination of the pull-up switching devices 310 and the pull-down switching devices 315 in each configurable driver circuit 305 allows for the configurable driver circuit 305 to either pull the output low, high, or not at all. For example, if only configurable driver circuit Slice-1 is pulling high and configurable driver circuit Slice 2 is pulling low, the effective output resistance of the voltage mode driver circuit 300 is the parallel combination of resistors R-1 and R-2 while the output voltage is a fraction of the voltage reference dictated by the values of R-1 and R-2.

As shown, the voltage mode driver circuit 300 consists of multiple configurable driver circuits 305 all connected to a single output pin 395. Each configurable driver circuit 305 is independently controlled and can be operated in one of the three states: pulled high, pulled low, and inactive. Since each active configurable driver circuit contributes to the resistance of the overall driver, the 45 Ohms requirement can be achieved by controlling the number of active configurable driver circuits driving the output. Each active configurable driver circuit can be independently pulled high or low thus allowing for the creation of a voltage that is a fraction of the voltage reference. Hence, by controlling both the number of active configurable driver circuits and the state of the active configurable driver circuits, both the impedance requirement of 45 Ohms and the amplitude requirement of 400 mV can be simultaneously satisfied. This is in contrast to voltage driver circuits which use an enable switch to affect resistance but provide no means for adjusting amplitude as each switch is being driven by the same control/data signals. As stated herein, the impedance and amplitude requirements are for the HS USB and other values may be substituted for other high speed serial input/output busses and compliant devices.

Figure 4:
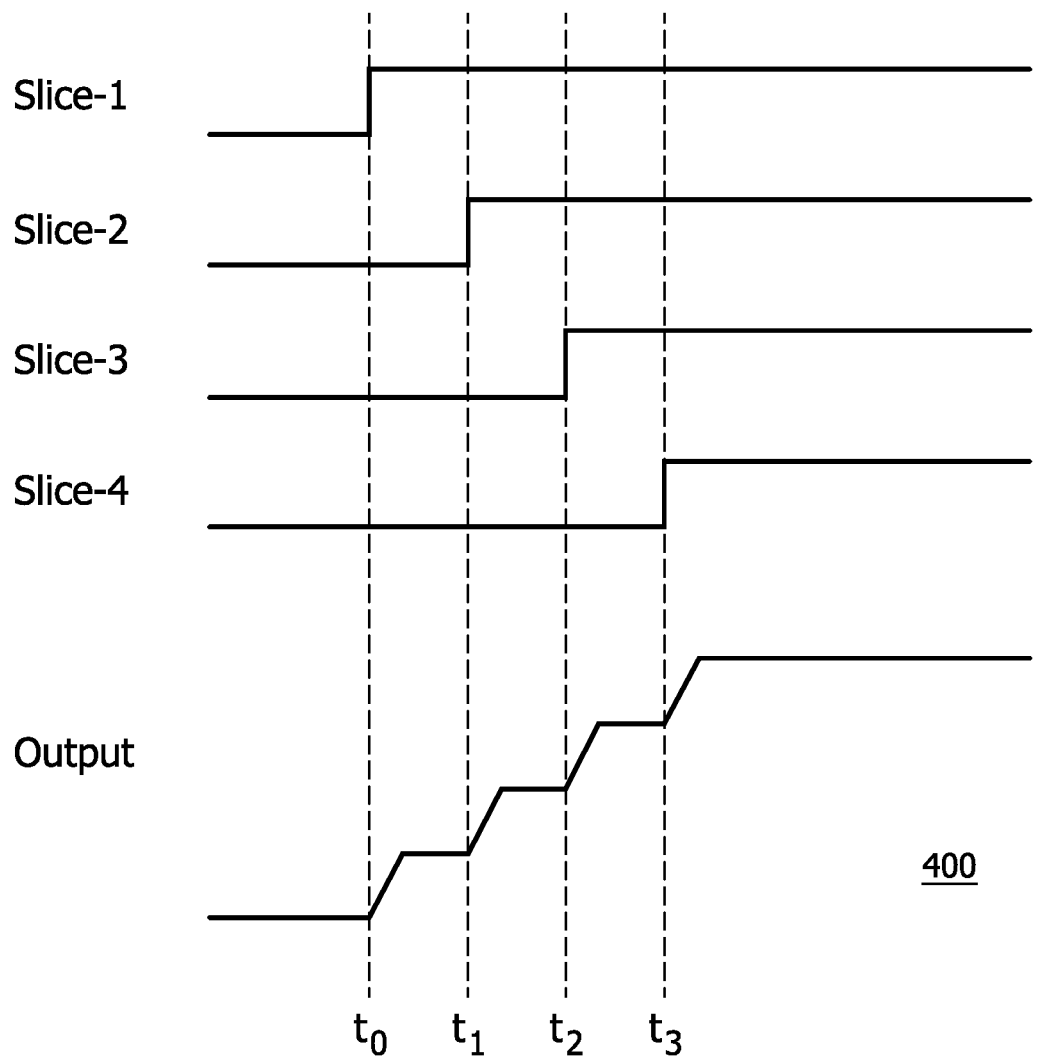
FIG. 4 is an example slew rate diagram using a voltage mode driver.

FIG. 4 is an example slew rate diagram 400 using the voltage mode driver circuit described herein. High speed serial input/output communications may also have slew rate requirements where the signal may not change faster than a predetermined number. For example, the HS USB specifications have a slew rate requirement where the signal may not change faster than 500 picoseconds. This may be implemented, for example, in the control logic 390 of FIG. 3. For example, assume that configurable driver circuits Slice-1, Slice-2, Slice-3 and Slice-4 are initially low (pull down state). At time $t_0$, configurable driver circuit Slice-1 may go high (pull up state) and the remaining configurable driver circuits Slice-2, Slice-3 and Slice-4 may remain low. At time $t_1$, configurable driver circuit Slice-2 may also be turned on and the remaining configurable driver circuits remain low. The time delay, for illustration purposes only, may be 100 picoseconds. In another example, the time delay may be different for each configurable driver circuit. This may continue until all configurable driver circuits are turned on, as applicable. This delayed turn on method controls the slew rate of the output signal and results in a step-wise output signal that meets the requirements.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Although features and elements are described above in particular combinations, each feature or element may be used alone without the other features and elements or in various combinations with or without other features and elements. The methods provided may be implemented in a general purpose computer, a processor or any IC that utilizes timestamps. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A device, comprising:
   at least one driver circuit including multiple configurable driver circuits, each configurable driver circuit connected to a voltage reference;
   a control module connected to each configurable driver circuit;
   the control module configured to set a number of active configurable driver circuits to obtain a predetermined resistance;

the control module configured to enable a pull up/pull down state of each active configurable driver circuit to obtain a predetermined voltage; and the control module configured to delay enabling the pull up/pull down state of an active configurable driver circuit by a predetermined interval to control slew rate, wherein the predetermined interval is different for each configurable driver circuit.

2. The device of claim 1, wherein a configurable driver circuit further comprises:
a pull up switch connected to the voltage reference and responsive to the control module; and
a pull down switch connected to ground and responsive to the control module, wherein the pull up switch and pull down switch are tied to an output pin.

3. The device of claim 2, further comprising:
a resistor connected between the output pin and the pull up switch and the pull down switch.

4. The device of claim 1, wherein the control module controls the slew rate of a signal output from the device.

5. The device of claim 1, wherein each configurable driver circuit is independently controlled by the control module.

6. The device of claim 1, wherein the device is a serial input/output bus device.

7. A computer-readable storage medium configured to store a set of instructions used for manufacturing the device of claim 1.

8. The computer-readable storage medium of claim 7, wherein the instructions are Verilog data instructions.

9. The computer-readable storage medium of claim 7, wherein the instructions are hardware description language (HDL) instructions.

10. A circuit, comprising:
a control logic circuit; and
configurable driver circuits responsive to the control logic circuit,
wherein the control logic circuit performs resistance tuning by activating a number of the configurable driver circuits,
wherein the control logic circuit performs amplitude tuning by enabling a pull up/pull down state of each activated configurable driver circuit, and
wherein the control logic circuit controls slew rate by delaying a control signal sent to each activated configurable driver circuit by a predetermined interval, wherein the predetermined interval is different for each configurable driver circuit.

11. The circuit of claim 10, wherein a configurable driver circuit further comprises:
a pull up transistor having a source connected to a voltage reference; and
a pull down transistor having a drain connected to ground, wherein the pull up transistor and the pull down transistor responsive to control signals from the control logic circuit.

12. The circuit of claim 11, wherein a drain of the pull up transistor and a source of the pull down transistor are tied to an output pin.

13. The circuit of claim 12, further comprising:
a resistive element connected to the drain of the pull up transistor and the source of the pull down transistor.

14. The circuit of claim 10, wherein each configurable driver circuit is independently controlled by the control logic circuit.

15. The circuit of claim 10, wherein the circuit is a serial input/output bus device.

16. A method for voltage mode driving a peripheral connector using a plurality of driver circuits, comprising:
resistance tuning by activating a number of the driver circuits;
amplitude tuning by enabling a pull up/pull down state of each activated driver circuit, and
delaying a control signal sent to each activated driver circuit by a predetermined interval to control slew rate, wherein the predetermined interval is different for each configurable driver circuit.

17. The method of claim 16, further comprising:
providing a pull up transistor having a source connected to a voltage reference and responsive to a control signal; and
providing a pull down transistor having a drain connected to ground, wherein the pull up transistor and the pull down transistor responsive to control signals from the control logic circuit.

18. The method of claim 16, wherein each driver circuit is independently controlled by a control circuit.

19. A computer readable media including hardware description language (HDL) code stored thereon, and when processed generates other intermediary data to create mask works for use in fabricating a processor that is configured to perform the method of claim 16.

* * * * *